(12) United States Patent
Zou et al.

(10) Patent No.: US 10,531,589 B2
(45) Date of Patent: Jan. 7, 2020

(54) SERVER CASING AND PLATE CONNECTING STRUCTURE THEREOF (71) Applicant: Wistron Corporation, New Taipei (TW)

(72) Inventors: Zhi-Peng Zou, New Taipei (TW); Zhong-hui Mao, New Taipei (TW); Zi-Wei He, New Taipei (TW)

(73) Assignee: Wistron Corporation, New Taipei (TW)

( * ) Notice: Subject to any disclaimer, the term of this patent is extended or adjusted under 35 U.S.C. 154(b) by 346 days.

(21) Appl. No.: 15/182,629

(22) Filed: Jun. 15, 2016

(65) Prior Publication Data
US 2017/0202101 A1 Jul. 13, 2017

(30) Foreign Application Priority Data
Jan. 12, 2016 (CN) .......................... 2016 1 0021938

(51) Int. Cl.
H05K 7/14 (2006.01)
G06F 1/18 (2006.01)
B21D 39/03 (2006.01)
F16B 5/00 (2006.01)
F16B 5/04 (2006.01)

(52) U.S. Cl.
CPC ......... H05K 7/1489 (2013.01); B21D 39/038 (2013.01); F16B 5/0096 (2013.01); F16B 5/045 (2013.01); G06F 1/187 (2013.01)

(58) Field of Classification Search
CPC ...... H05K 7/1487; H05K 7/1489; H05K 7/18; H05K 5/0004; H05K 5/0217; G06F 1/187; F16B 5/0096; F16B 17/002; F16B 17/008; F16B 5/045; Y10T 403/49; Y10T 403/4924; Y10T 403/4949; Y10T 403/4966; B21D 39/038
See application file for complete search history.

(56) References Cited

U.S. PATENT DOCUMENTS

| 2,630,175 | A | * | 3/1953 | Dickerman | .......... B21D 39/038 29/509 |
| 4,404,835 | A | * | 9/1983 | Frith | ...................... B21D 28/34 29/243.5 |
| 5,086,997 | A | * | 2/1992 | Glass | .................. B29C 66/7392 244/123.3 |
| 5,770,320 | A | * | 6/1998 | Hughes | ................... F16B 5/045 220/690 |

(Continued)

FOREIGN PATENT DOCUMENTS

FR 2744656 A1 * 8/1997 ............. B21B 11/00

Primary Examiner — Daniel J Troy
Assistant Examiner — Ryan A Doyle
(74) Attorney, Agent, or Firm — Winston Hsu (57) ABSTRACT A server casing includes a frame and a plate connecting structure disposed in the frame and including a plate and a board. A first rivet hole of the plate has a first outer hole edge and a first inner hole edge greater than the first outer hole edge. A first guide surface connects the first outer hole edge and the first inner hole edge. The board has a board edge corresponding to the first rivet hole. A first arm is formed on the board edge. After the first arm is pressed to abut against the first guide surface, the pressed first arm deforms along the first guide surface to be located in the first rivet hole, so as to fix the board to the plate.

14 Claims, 10 Drawing Sheets (56) References Cited

U.S. PATENT DOCUMENTS

| | | | |
|---|---|---|---|
| 6,761,502 B2* | 7/2004 | Bishop | B21D 39/03 |
| | | | 403/278 |
| 9,601,877 B2* | 3/2017 | Yang | H01R 13/659 |
| 2009/0142129 A1* | 6/2009 | Webb | B21D 39/038 |
| | | | 403/242 |
| 2015/0153790 A1* | 6/2015 | Ting | G11B 33/025 |
| | | | 361/679.33 |

* cited by examiner

SERVER CASING AND PLATE CONNECTING STRUCTURE THEREOF

BACKGROUND OF THE INVENTION

1. Field of the Invention

The present invention relates to a server casing and a plate connecting structure thereof, and more specifically, to a server casing for riveting an arm of a board to a rivet hole of a plate to fix the board to the plate and a plate connecting structure thereof.

2. Description of the Prior Art

In general, a server casing usually utilizes assembly of aboard and a plate to partition its internal containing space for containing disk drives (e.g. 3.5" hard disk drive) stacked in a horizontal arrangement respectively. A conventional plate connecting design is to bend a board edge of the board to form a bending portion and rivet the bending portion to the plate for fixing the board to the plate. However, in this design, since the aforesaid bending portion additionally occupies partial internal containing space of the server casing, it would influence efficiency of the server casing in use of the internal containing space, so as to decrease the allowed amount of the disk drive which the server casing could contain and cause waste of space.

SUMMARY OF THE INVENTION

The present invention provides a server casing including a frame and a plate connecting structure. The plate connecting structure is disposed in the frame. The plate connecting structure includes a plate and a board. The plate has at least one first rivet hole. The at least one first rivet hole has a first outer hole edge located on an outer surface of the plate and a first inner hole edge located on an inner surface of the plate. The first outer hole edge is greater than the first inner hole edge. A first guide surface connects the first outer hole edge and the first inner hole edge. The board has at least one board edge corresponding to the at least one first rivet hole. At least one first arm is formed on the at least one board edge. After the at least one first arm is pressed to abut against the first guide surface, the pressed first arm deforms along the first guide surface to be located in the at least one first rivet hole so as to fix the board to the plate.

The present invention further provides a plate connecting structure for partitioning at least one containing space in a server casing. The plate connecting structure includes a plate and a board. The plate has at least one first rivet hole. The at least one first rivet hole has a first outer hole edge located on an outer surface of the plate and a first inner hole edge located on an inner surface of the plate. The first outer hole edge is greater than the first inner hole edge. A first guide surface connects the first outer hole edge and the first inner hole edge. The board has at least one board edge corresponding to the at least one first rivet hole. At least one first arm is formed on the at least one board edge. After the at least one first arm is pressed to abut against the first guide surface, the pressed first arm deforms along the first guide surface to be located in the at least one first rivet hole so as to fix the board to the plate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
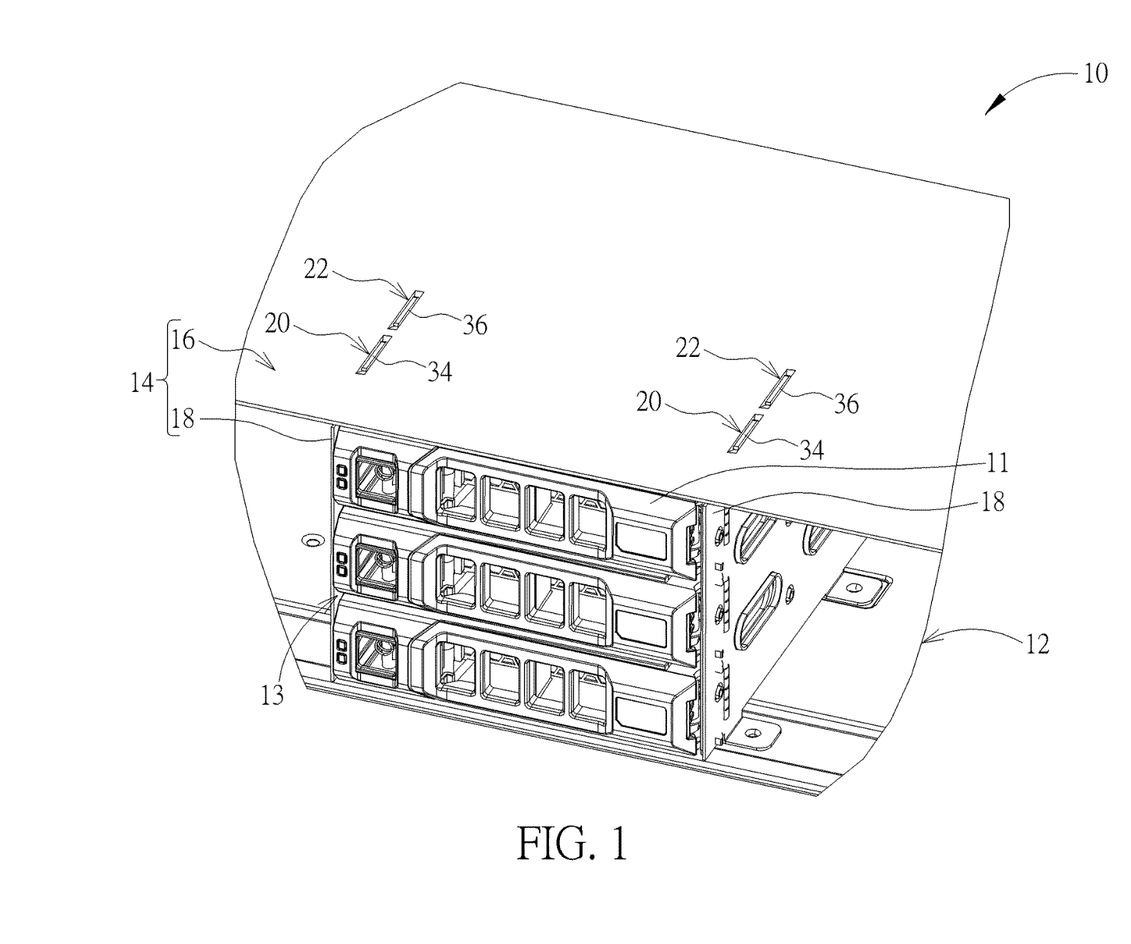
FIG. 1 is a partial diagram of a server casing according to an embodiment of the present invention.

Please refer to FIG. 1, which is a partial diagram of a server casing 10 according to an embodiment of the present invention. The server casing 10 could be used for containing a plurality of disk drives 11 (e.g. 3.5" hard disk drive) to perform data transfer and storage of a server. As shown in FIG. 1, the server casing 10 includes a frame 12 and a plate connecting structure 14. The plate connecting structure 14 is disposed in the frame 14 for partitioning an internal containing space of the frame to contain the plurality of disk drives 11. The plate connecting structure 14 includes at least one plate 16 (an upper plate and a lower plate as shown in FIG. 1, but not limited thereto) and at least one board 18 (two shown in FIG. 1, but not limited thereto). The frame 12 could adopt a conventional server casing design (e.g. a frame composed of an upper plate, a lower plate, and two side boards), and the related description is omitted herein since it is commonly seen in the prior art.

Figure 2:
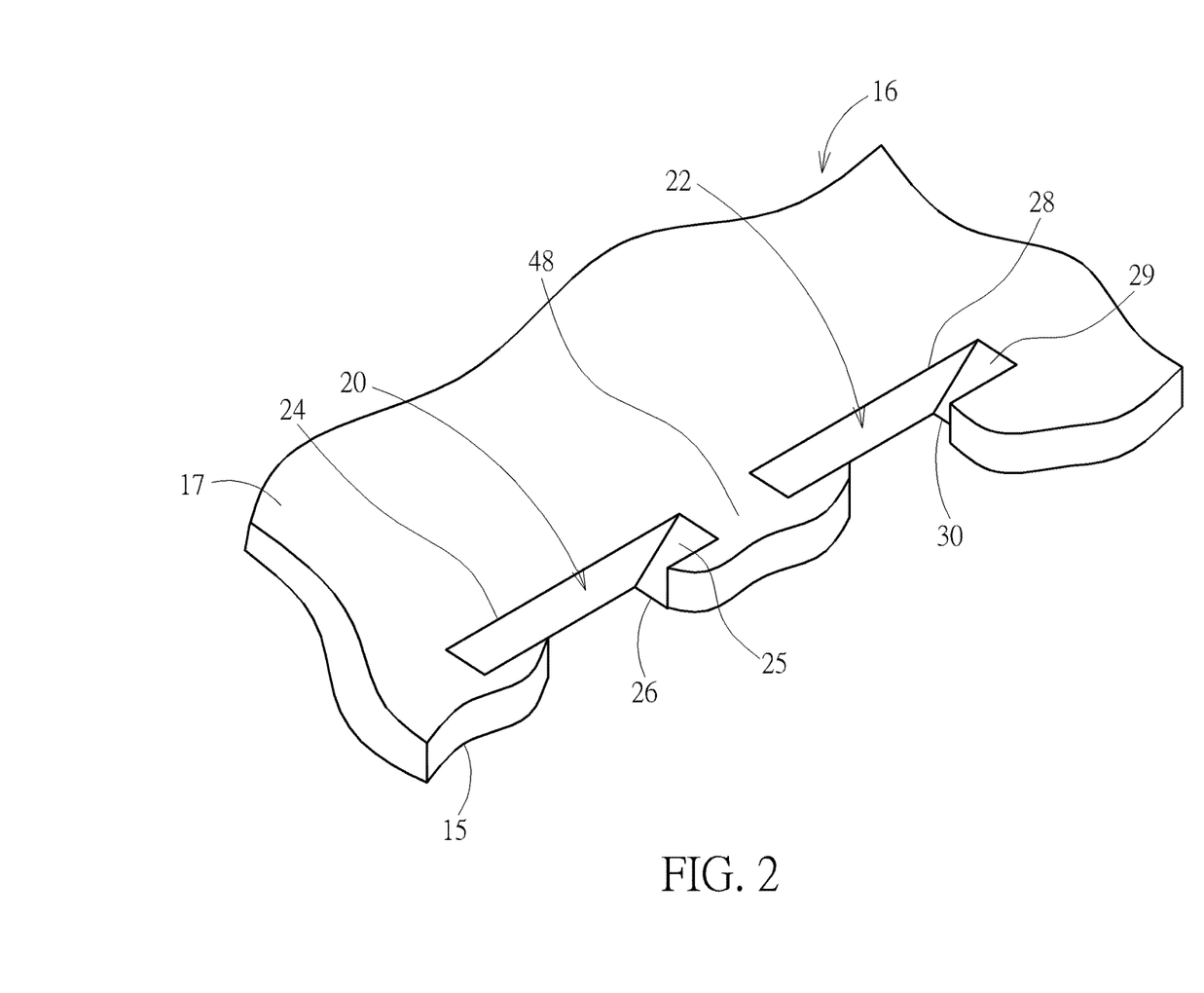
FIG. 2 is a partial enlarged diagram of a plate in FIG. 1.
Figure 3:
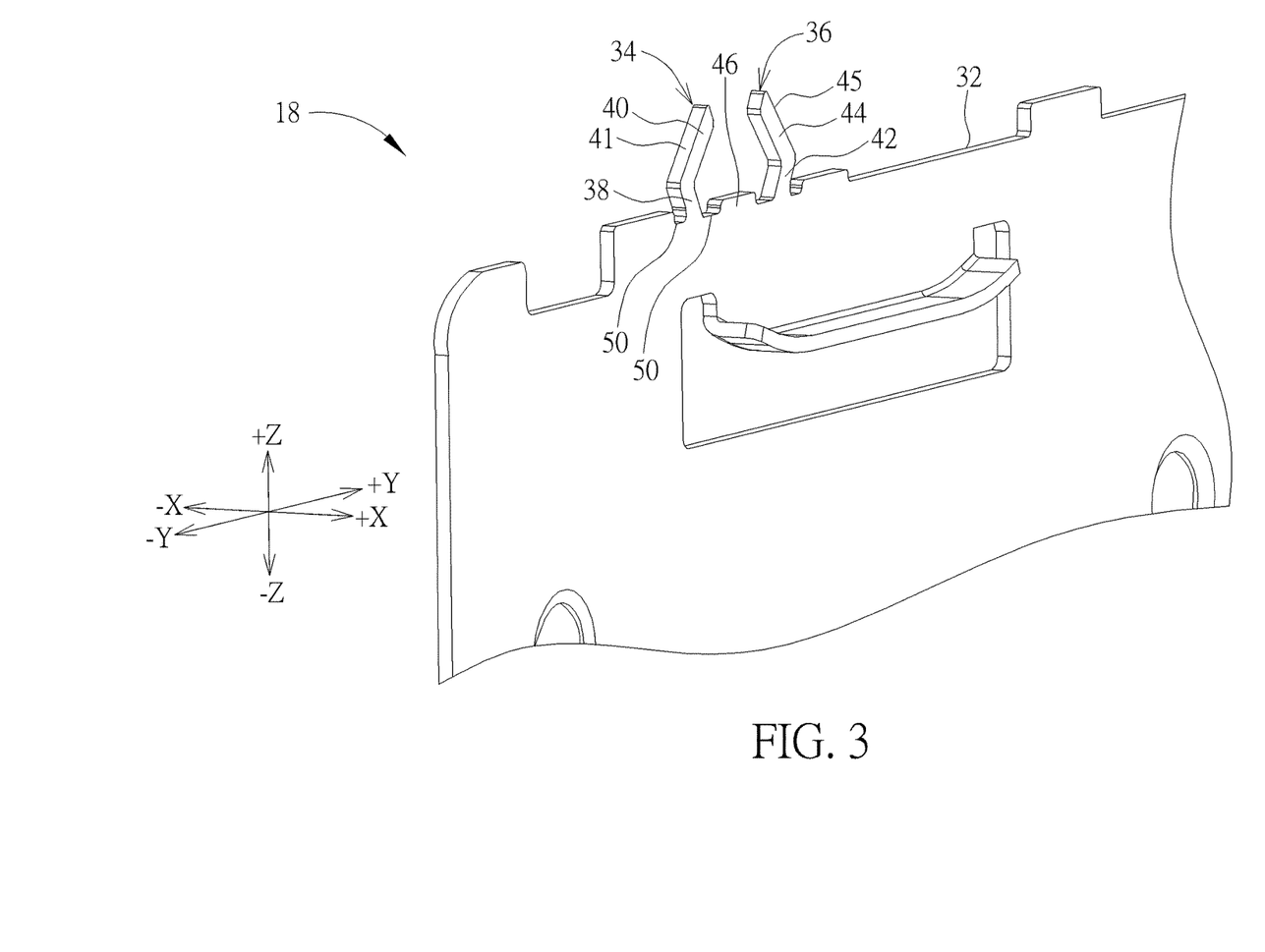
FIG. 3 is a partial enlarged diagram of a board in FIG. 1.

More detailed description for fixing one plate 16 to the corresponding board 18 is provided as follows. As for the related description for other plates 16 and the corresponding boards 18, it could be reasoned by analogy and omitted herein. Please refer to FIG. 1, FIG. 2, and FIG. 3. FIG. 2 is a partial enlarged diagram of the plate 16 in FIG. 1. FIG. 3 is a partial enlarged diagram of the board 18 in FIG. 1. As shown in FIG. 1, FIG. 2, and FIG. 3, the plate 16 has at least one first rivet hole 20 (one shown in FIG. 2, but not limited thereto) and a second rivet hole 22 located at a side of the first rivet hole 20. The first rivet hole 20 has a first outer hole edge 24 located on an outer surface 17 of the plate 16 and a first inner hole edge 26 located on an inner surface 15 of the plate 16. The second rivet hole 22 has a second outer hole edge 28 located on the outer surface 17 of the plate 16 and a second inner hole edge 30 located on the inner surface 15 of the plate 16. The first outer hole edge 24 is greater than the first inner hole edge 26, and a first guide surface 25 connects the first outer hole edge 24 and the first inner hole edge 26. The second outer hole edge 28 is greater than the second inner hole edge 30, and a second guide surface 29 connects the second outer hole edge 28 and the second inner hole edge 30. To be more specific, in this embodiment, an area of the first outer hole edge 24 is greater than an area of the first inner hole edge 26 and an area of the second outer hole edge 28 is greater than an area of the second inner hole edge 30, meaning that the first rivet hole 20 and the second rivet hole 22 could be preferably wider at the top and narrower at the bottom. The first guide surface 25 and the second guide surface 29 could be preferably an inclined surface, but not limited thereto. That is, the first guide surface 25 and the second guide surface 29 could adopt other guide surface design, such as a curved surface.

The board 18 has at least one plate edge 32 (only an upper plate edge located at the top of the board 18 is depicted in FIG. 3 as an example, but not limited thereto) corresponding to the first rivet hole 20. At least one first arm 34 (one shown in FIG. 3, but not limited thereto, meaning that amount of the first arm 34 could vary with the practical application of the plate connecting structure 14) and a second arm 36 opposite to the first arm 34. In this embodiment, the first arm 34 could preferably have a first arm portion 38 and a second arm portion 40 (but not limited thereto). The first arm portion 38 extends from the board edge 32, and the second arm portion 40 extends from the first arm portion 38. The second arm 36 could preferably have a third arm portion 42 and a fourth arm portion 44 (but not limited thereto). The third arm portion 42 extends from the board edge 32, and the fourth arm portion 44 extends from the third arm portion 42. As shown in FIG. 3, a length of the first arm portion 38 could be preferably less than a length of the second arm portion 40 and a length of the third arm portion 42 could be preferably less than a length of the fourth arm portion 44 (but not limited thereto), for increasing the structural strength of the first arm 34 and the structural strength of the second arm 36 so as to efficiently prevent structural breaks of the first arm 34 and the second arm 36 during the riveting process. In practical application, a first bending direction of the first arm 34 could be preferably a −Y-axis direction as shown in FIG. 3 and be opposite to a second bending direction (i.e. a +Y-axis direction as shown in FIG. 3) of the second arm 36, for forming a riveting structure which is narrower at the top and wider at the bottom. Accordingly, the aforesaid structural design could prevent constructive interference between the first arm 34 and the first rivet hole 20 and constructive interference between the second arm 36 and the second rivet hole 22. Furthermore, the first arm 34 could be preferably symmetrical to the second arm 36, so as to evenly distribute the pressure exerted on the first arm 34 and the second arm 36 during the riveting process for pressing the first arm 34 and the second arm 36 into the first rivet hole 20 and the second rivet hole 22 smoothly.

Furthermore, in this embodiment, the board edge 32 could preferably have a support platform 46 for supporting a bridge structure 48 located between the first rivet hole 20 and the second rivet hole 22, for preventing the first rivet hole 20 and the second rivet hole 22 from being inwardly sunken during the riveting process. Moreover, for preventing flash of the first arm 34 toward ±X-axis direction in FIG. 3 during the riveting process (it would cause a flash structure with a considerable thickness formed on a position where the first arm 34 is riveted to the first rivet hole 34 so as to occupy the internal containing space of the frame 12), the board edge 32 could preferably have a flash groove 50 formed on at least one side of the first arm portion 38 of the first arm 34 (two flash grooves 50 formed on two sides of the first arm portion 38 respectively as shown in FIG. 3, but not limited thereto). Accordingly, the flash groove 50 could contain deformed portions of the first arm portion 38 and the second arm portion 40 during the riveting process. The aforesaid groove design could also be applied to the second arm 36, and the related description could be reasoned by analogy according to the aforesaid description.

Figure 4:
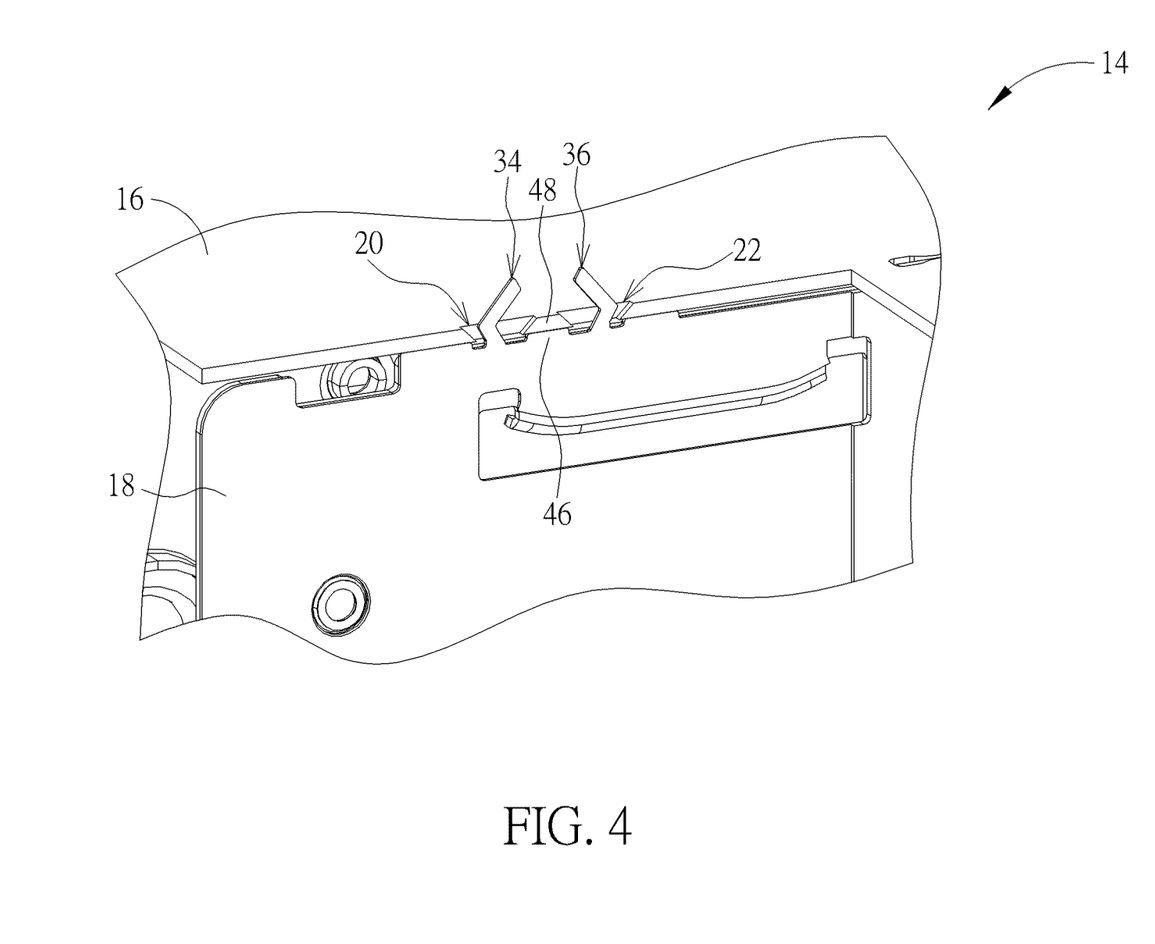
FIG. 4 is a cross sectional diagram of a first arm and a second arm in FIG. 3 passing through a first rivet hole and a second rivet hole respectively.
Figure 5:
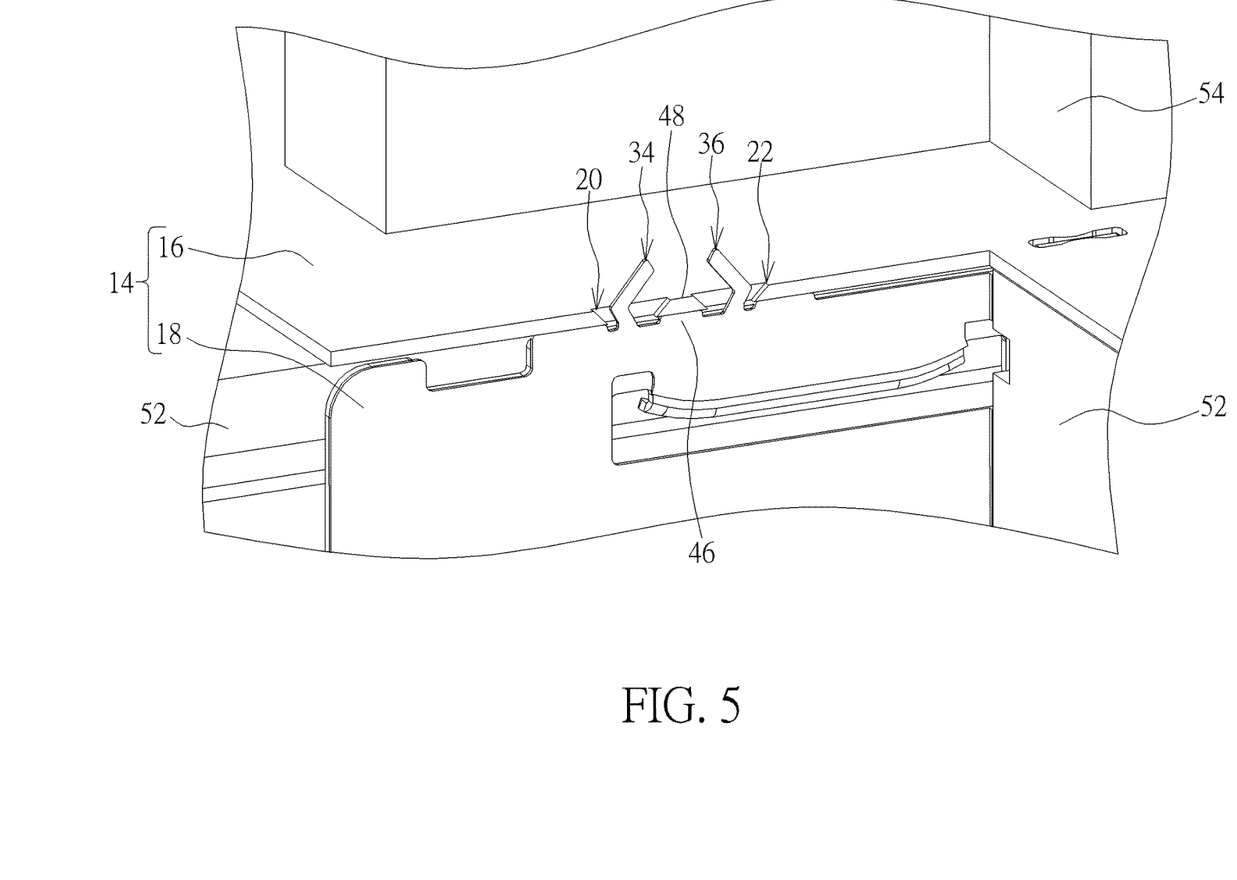
FIG. 5 is a partial cross sectional diagram of two clamping blocks clamping the board in FIG. 4 and a punching head punching the first arm and the second arm.

Via the aforesaid design, when a user wants to rivet the board 18 to the plate 16, the user just needs to make the first arm 34 and the second arm 36 on the board 18 pass through the first rivet hole 20 and the second rivet hole 22 respectively (as shown in FIG. 4, which is a cross sectional diagram of the first arm 34 and the second arm 36 in FIG. 3 passing through the first rivet hole 20 and the second rivet hole 22 respectively). Subsequently, the user could utilize a riveting tool to fix the board 18 (e.g. utilizing two clamping blocks 52 to clamp the board 18 as shown in FIG. 5), and could rivet the first arm 34 and the second arm 36 to the plate 16 by a punching process (e.g. utilizing a punching head 54 in FIG. 5 to perform a punching process on the first arm 34 and the second arm 36). To be more specific, during the aforesaid process, the second arm portion 40 of the first arm 34 and the fourth arm portion 44 of the second arm 36 could be pressed by the punching head 54 to deform to abut against the first guide surface 25 and the second guide surface 29 respectively (as shown in FIG. 6, which is a cross sectional diagram of the second arm portion 40 of the first arm 34 and the fourth arm portion 44 of the second arm 36 in FIG. 5 deforming to abut against the first guide surface 25 and the second guide surface 29 respectively).

Figure 6:
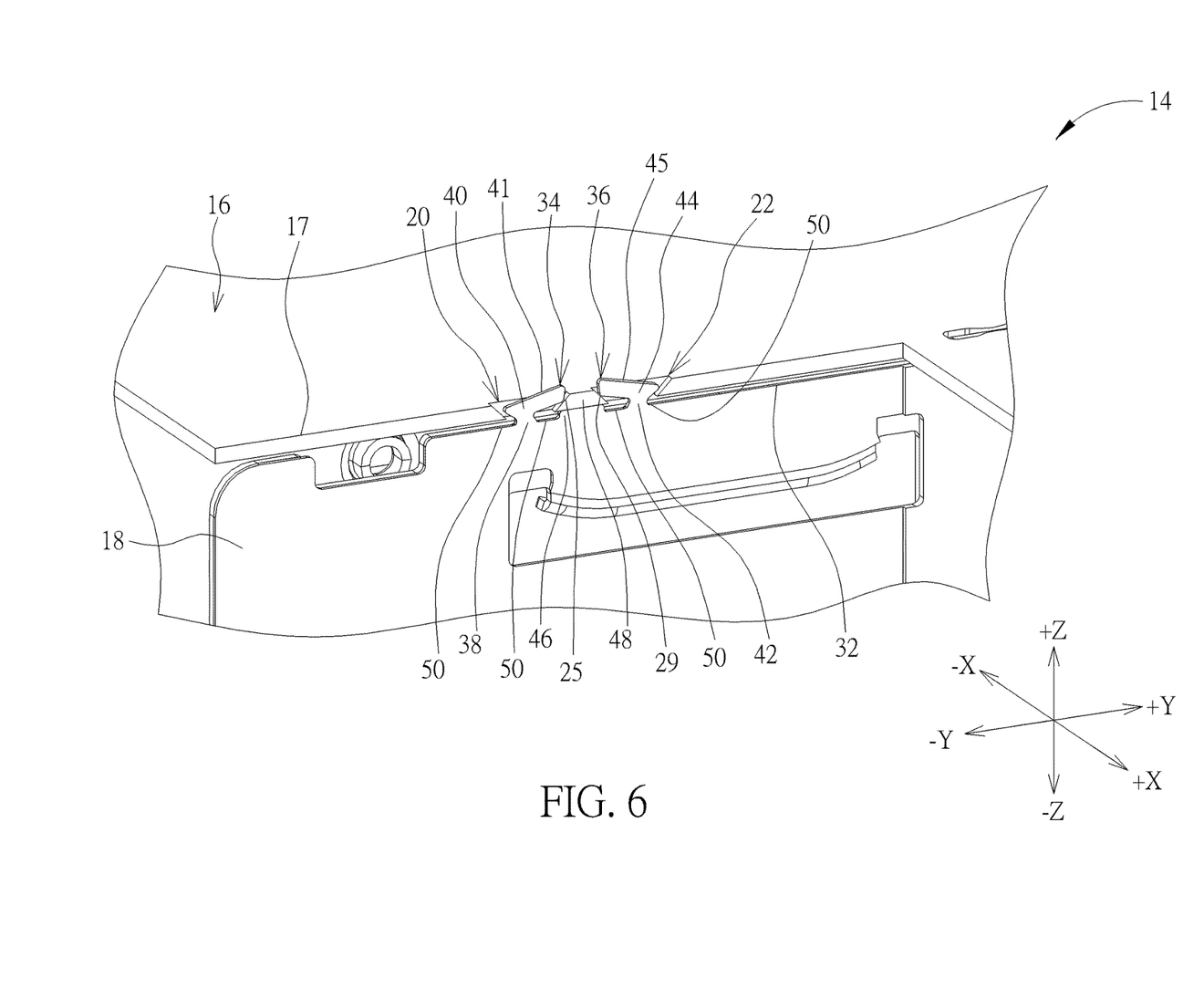
FIG. 6 is a cross sectional diagram of a second arm portion of the first arm and a fourth arm portion of the second arm in FIG. 5 deforming to abut against a first guide surface and a second guide surface respectively.
Figure 7:
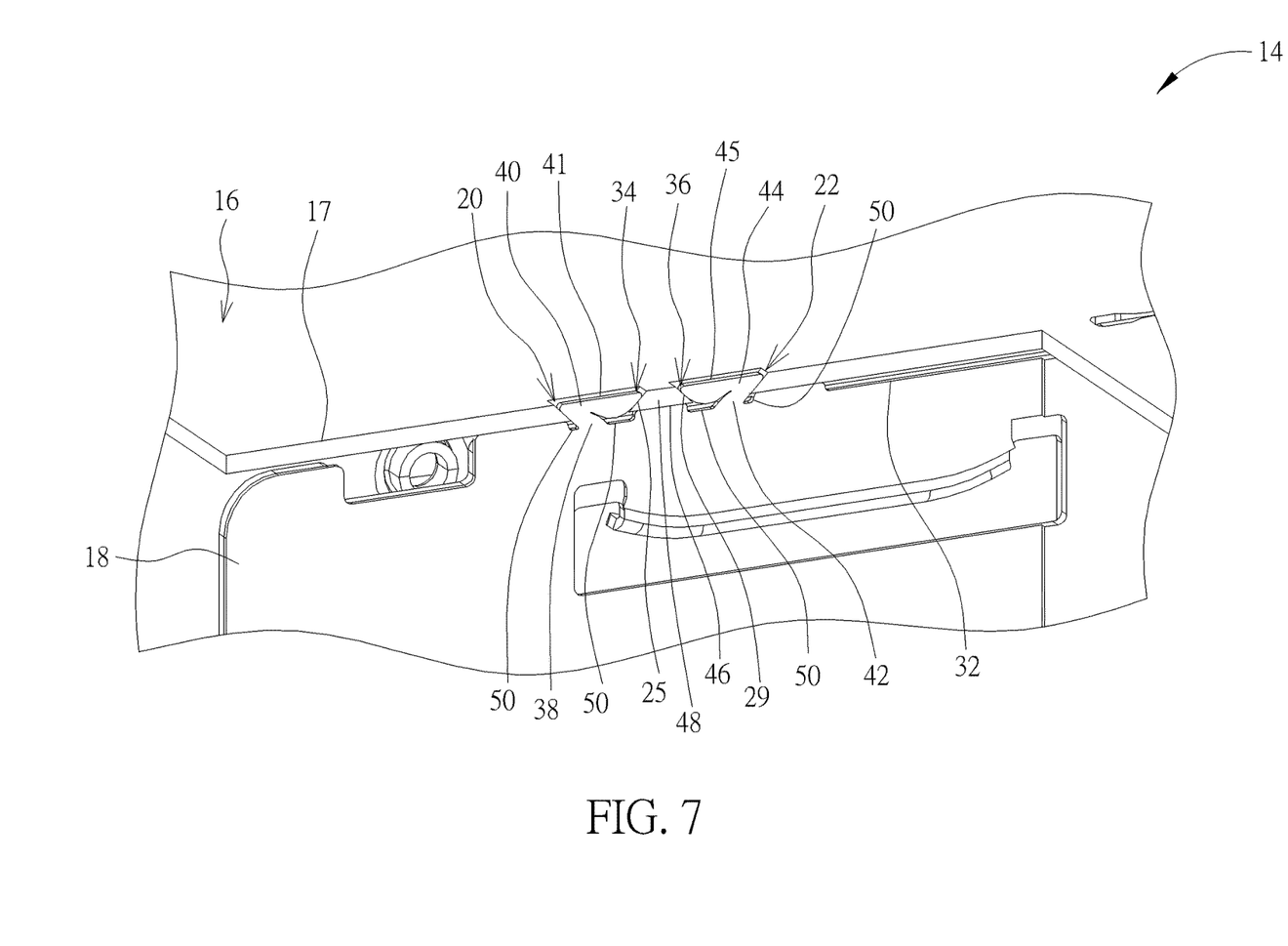
FIG. 7 is a cross sectional diagram of the first arm and the second arm in FIG. 6 being located in the first rivet hole and the second rivet hole respectively.

Subsequently, the pressed second arm portion 40 could deform with the first arm portion 38 along the first guide surface 25 (i.e. in a −Y-axis direction as shown in FIG. 6) to be located in the first rivet hole 20 (as shown in FIG. 7, which is a cross sectional diagram of the first arm 34 and the second arm 36 in FIG. 6 being located in the first rivet hole 20 and the second rivet hole 22 respectively), so as to make a first pressed surface 41 of the second arm portion 40 preferably coplanar with the outer surface 17 of the plate 16 (but not limited thereto). At the same time, the pressed fourth arm portion 44 could deform with the third arm portion 42 along the second guide surface 29 (i.e. in a +Y-axis direction as shown in FIG. 6) to be located in the second rivet hole 22 (as shown in FIG. 7), so as to make a second pressed surface 45 of the fourth arm portion 44 preferably coplanar with the outer surface 17 of the plate 16 (but not limited thereto).

Via the aforesaid design that the first arm 34 is riveted to the first rivet hole 20 and the second arm 36 is riveted to the second rivet hole 22, the board 18 could be fixed to the plate 16 steadily for partitioning a containing space 13 from the frame 12 (as shown in FIG. 1) so as to contain the disk drives 11. In such a manner, since the plate connecting structure provided by the present invention adopts the aforesaid design that the arm is riveted to the rivet hole without additionally occupying the internal containing space of the server casing, the present invention could maximize efficiency of the server casing in use of the internal containing space, so as to increase the allowed amount of the disk drive which the server casing could contain.

It should be mentioned that the structural designs of the arm and the rivet hole could be not limited to the aforesaid embodiment. For example, in another embodiment, the present invention could omit the second arm and the second rivet hole, and could only utilize riveting of the first arm and the first rivet hole to fix the board to the plate, so as to simplify the structural design of the plate connecting structure of the present invention. Furthermore, the bending direction of the first arm and the bending direction of the second arm are not limited to the aforesaid embodiment, meaning that the present invention could adopt the first arm bends in the −Y-axis direction in FIG. 3 and the second arm bends in the +Y-axis direction to cooperatively form a riveting structure which is wider at the top and narrower at the bottom, so as to improve flexibility of the structural design of the plate connecting structure.

Figure 8:
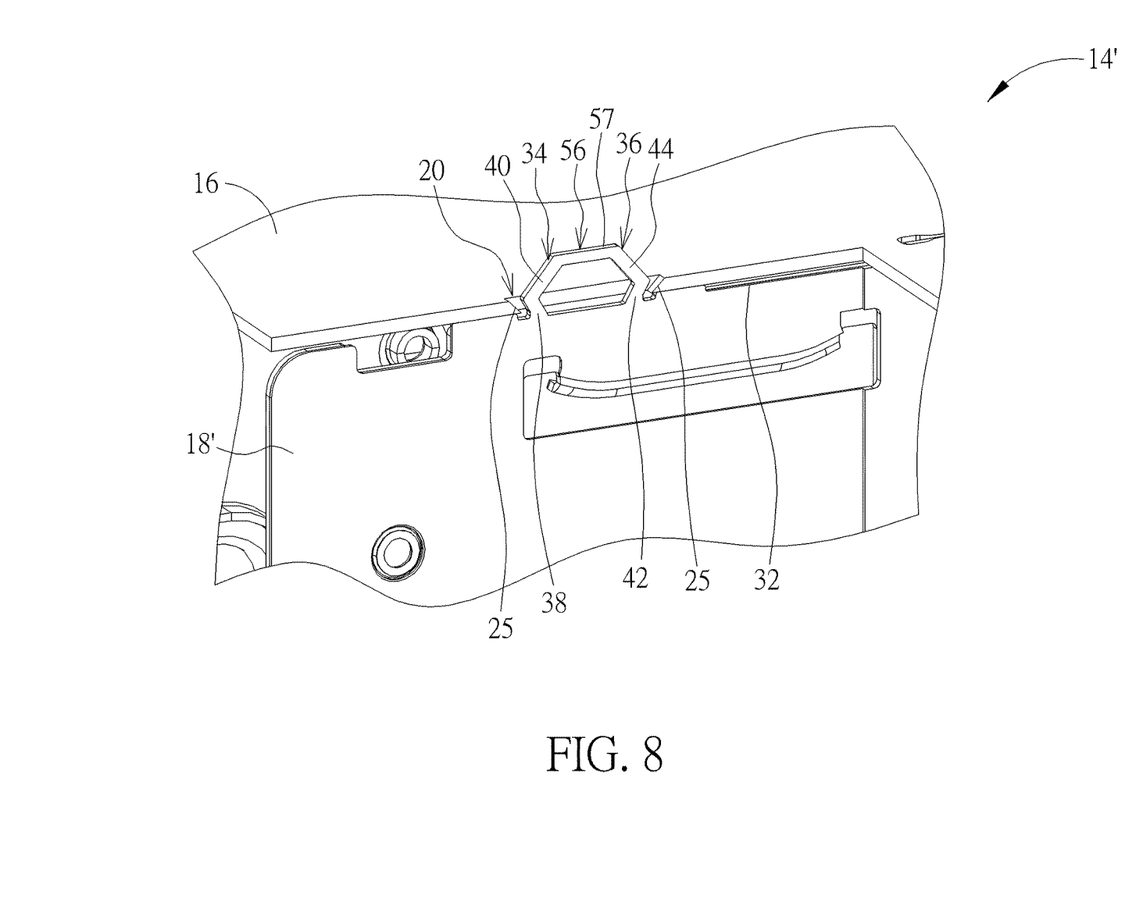
FIG. 8 is a partial cross sectional diagram of a plate connecting structure according to another embodiment of the present invention.

Furthermore, the design of the arm of the present invention is also not limited to the aforesaid embodiment. For example, please refer to FIG. 8, which is a partial cross sectional diagram of a plate connecting structure 14' according to another embodiment of the present invention. Components both mentioned in this embodiment and the aforesaid embodiment represent components with similar functions or structures, and the related description is omitted herein. As shown in FIG. 8, the plate connecting structure 14' includes the plate 16 and a board 18'. In this embodiment, the plate 16 only has the first rivet hole 20. The board 18' has the first arm 34 and the second arm 36 formed thereon corresponding to the first rivet hole 20 of the plate 16. A transverse arm 56 extends between the first arm 34 and the second arm 36. To be more specific, in this embodiment, the transverse arm 56 extends between the second arm portion 40 of the first arm 34 and the second arm portion 44 of the second arm 36.

Via the aforesaid design, when the user wants to rivet the board 18' to the plate 16, the user just needs to make the first arm 34, the second arm 36, and the transverse arm 56 on the board 18' pass through the first rivet hole 20 (as shown in FIG. 8). Subsequently, the user could perform a riveting process on the first arm 34, the second arm 36, and the transverse arm 56 for riveting the board 18' to the plate 16 (e.g. utilizing the two clamping blocks 52 to clamp the board 18' as shown in FIG. 5, then utilizing the punching head 54 in FIG. 5 to perform a punching process on the first arm 34, the second arm 36, and the transverse arm 56). To be more specific, during the aforesaid process, the second arm portion 40 of the first arm 34 and the fourth arm portion 44 of the second arm 36 could be pressed by the punching head 54 to deform to abut against the first guide surface 25 of the first rivet hole 20 respectively (as shown in FIG. 9, which is a cross sectional diagram of the second arm portion 40 and the fourth arm portion 44 in FIG. 8 deforming to abut against the first guide surface 25 respectively).

Figure 9:
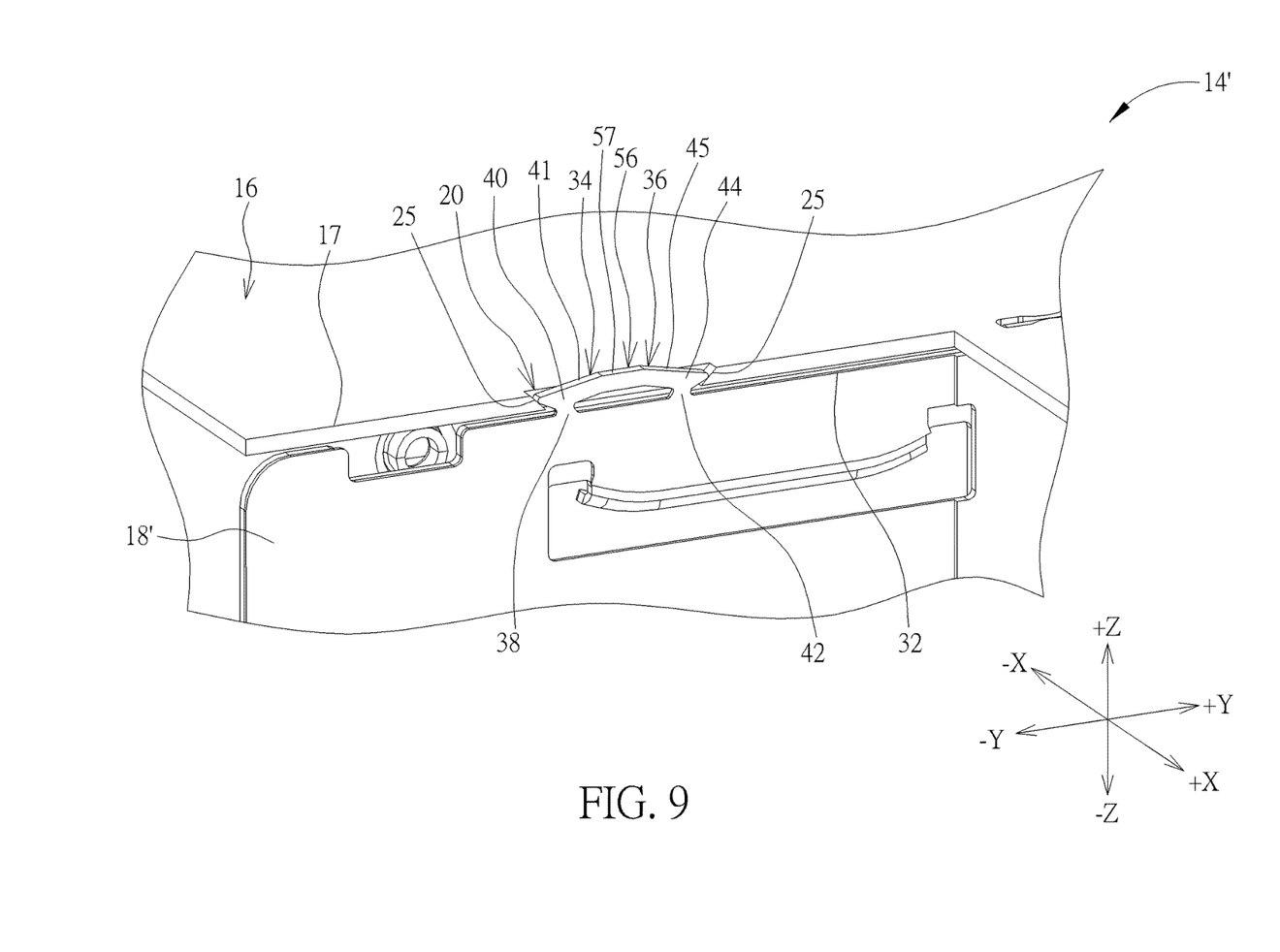
FIG. 9 is a cross sectional diagram of the second arm portion and the fourth arm portion in FIG. 8 deforming to abut against the first guide surface respectively.
Figure 10:
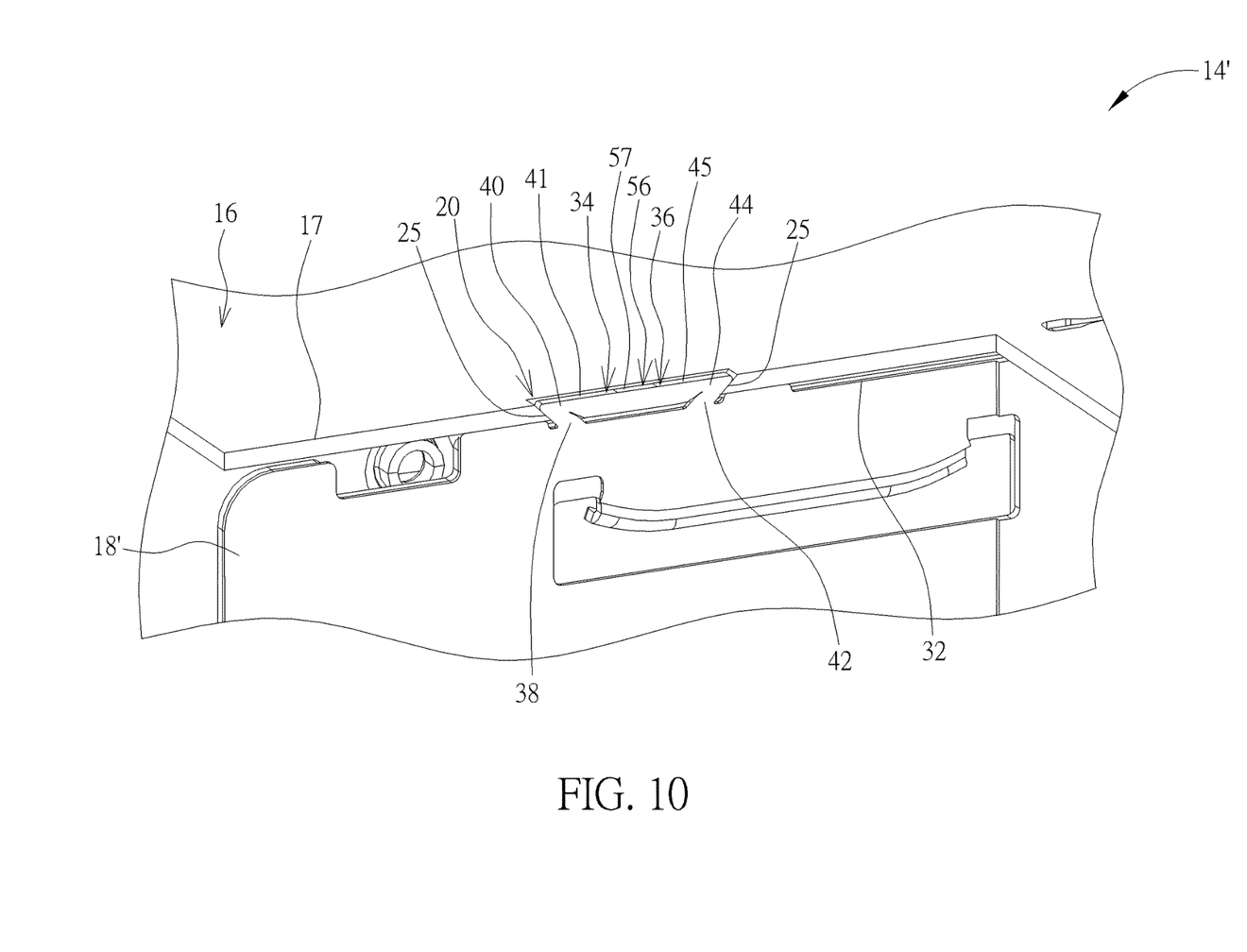
FIG. 10 is a cross sectional diagram of the first arm, the second arm, and a transverse arm in FIG. 9 being located in the first rivet hole.

Subsequently, the pressed second arm portion 40 could deform with the first arm portion 38 along the first guide surface 25 (i.e. in the +Y-axis direction as shown in FIG. 9) and the pressed fourth arm portion 44 could deform with the third arm portion 42 along the first guide surface 25 (i.e. in the −Y-axis direction as shown in FIG. 9) to be located in the first rivet hole 20 (as shown in FIG. 10), so as to make the first pressed surface 41 of the second arm portion 40, the second pressed surface 45 of the fourth arm portion 44, and a third pressed surface 57 of the transverse arm 56 coplanar with the outer surface 17 of the plate 16 (but not limited thereto).

Via the aforesaid design that the first rivet hole is riveted to the first arm 34, the second arm 36, and the transverse arm 56, the board 18' could be fixed to the plate 16 steadily. In such a manner, since the plate connecting structure provided by the present invention adopts the aforesaid design that the arm is riveted to the rivet hole without additionally occupying the internal containing space of the server casing, the present invention could maximize the efficiency of the server casing in use of the internal containing space, so as to increase the allowed amount of the disk drive which the server casing could contain.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server casing comprising:
   a frame; and
   a plate connecting structure disposed in the frame, the plate connecting structure comprising:
      a plate having a first rivet hole and a second rivet hole, the first rivet hole being symmetrical to the second rivet hole, the first rivet hole having a first outer hole edge located on an outer surface of the plate and a first inner hole edge located on an inner surface of the plate, the first outer hole edge being longer than the first inner hole edge, a first guide surface connecting the first outer hole edge and the first inner hole edge, the second rivet hole having a second outer hole edge located on the outer surface of the plate and a second inner hole edge located on the inner surface of the plate, the second outer hole edge being longer than the second inner hole edge, a second guide surface connecting the second outer hole edge and the second inner hole edge; and
      a board having at least one board edge corresponding to the first rivet hole, a first arm and a second arm, the first arm and the second arm bending in opposite directions and being spaced apart from each other, the first arm being symmetrical to the second arm, the first arm having a first arm portion and a second arm portion, the first arm portion being connected between the at least one board edge and the second arm portion to make the second arm portion protrude from the at least one board edge, the second arm having a third arm portion and a fourth arm portion, the third arm portion extending from the at least one board edge, the fourth arm portion extending from the third arm portion, the second arm portion and the fourth arm portion being configured to deform along the first guide surface and the second guide surface respectively to make the first arm and the second arm be located in the first rivet hole and the second rivet hole respectively and be engaged with the first guide surface and the second guide surface by surface-to-surface contact respectively so as to fix the board to the plate after an end of the second arm portion away from the first arm portion and an end of the fourth arm portion away from the third arm portion ares configured to be pressed to abut against the first guide surface and the second guide surface respectively.

2. The server casing of claim 1, wherein after the second arm portion is configured to be pressed to abut against the first guide surface, the second arm portion is configured to deform with the first arm portion along the first guide surface to be located in the first rivet hole so as to make a first pressed surface of the second arm portion coplanar with the outer surface of the plate.

3. The server casing of claim 2, wherein a length of the first arm portion is less than a length of the second arm portion.

4. The server casing of claim 1, wherein a flash groove is formed on the at least one board edge corresponding to at least one side of the first arm to contain a deformed portion of the first arm when the first arm is configured to deform along the first guide surface to be located in the at least first rivet hole.

5. The server casing of claim 1, wherein after the fourth arm portion is configured to be pressed to abut against the second guide surface, the fourth arm portion is configured to deform with the third arm portion along the second guide surface to be located in the second rivet hole, so as to make a second pressed surface of the fourth arm portion coplanar with the outer surface of the plate.

6. The server casing of claim 1, wherein an area of the first outer hole edge is greater than an area of the first inner hole edge, and an area of the second outer hole edge is greater than an area of the second inner hole edge.

7. The server casing of claim 1, wherein the at least one board edge has a support platform for supporting a bridge structure located between the first rivet hole and the second rivet hole.

8. A plate connecting structure for partitioning at least one containing space in a server casing, the plate connecting structure comprising:
   a plate having a first rivet hole and a second rivet hole, the first rivet hole being symmetrical to the second rivet hole, the first rivet hole having a first outer hole edge located on an outer surface of the plate and a first inner hole edge located on an inner surface of the plate, the first outer hole edge being longer than the first inner hole edge, a first guide surface connecting the first outer hole edge and the first inner hole edge, the second rivet hole having a second outer hole edge located on the outer surface of the plate and a second inner hole edge located on the inner surface of the plate, the second outer hole edge being longer than the second inner hole edge, a second guide surface connecting the second outer hole edge and the second inner hole edge; and
   a board having at least one board edge corresponding to the first rivet hole, a first arm and a second arm, the first arm and the second arm bending in opposite directions and being spaced apart from each other, the first arm being symmetrical to the second arm, the first arm having a first arm portion and a second arm portion, the first arm portion being connected between the at least one board edge and the second arm portion to make the second arm portion protrude from the at least one board edge, the second arm having a third arm portion and a fourth arm portion, the third arm portion extending from the at least one board edge, the fourth arm portion extending from the third arm portion, the second arm portion and the fourth arm portion being configured to deform along the first guide surface and the second guide surface respectively to make the first arm and the second arm be located in the first rivet hole and the second rivet hole respectively and be engaged with the first guide surface and the second guide surface by surface-to-surface contact respectively so as to fix the board to the plate after an end of the second arm portion away from the first arm portion and an end of the fourth arm portion away from the third arm portion are configured to be pressed to abut against the first guide surface and the second guide surface respectively.

9. The plate connecting structure of claim 8, wherein after the second arm portion is configured to be pressed to abut against the first guide surface, the second arm portion being configured to deform with the first arm portion along the first guide surface to be located in the first rivet hole, so as to make a first pressed surface of the second arm portion coplanar with the outer surface of the plate.

10. The plate connecting structure of claim 9, wherein a length of the first arm portion is less than a length of the second arm portion.

11. The plate connecting structure of claim 8, wherein a flash groove is formed on the at least one board edge corresponding to at least one side of the first arm to contain a deformed portion of the first arm when the first arm is configured to deform along the first guide surface to be located in the first rivet hole.

12. The plate connecting structure of claim 8, wherein after the fourth arm portion is configured to be pressed to abut against the second guide surface, the fourth arm portion is configured to deform with the third arm portion along the second guide surface to be located in the second rivet hole, so as to make a second pressed surface of the fourth arm portion coplanar with the outer surface of the plate.

13. The plate connecting structure of claim 8, wherein an area of the first outer hole edge is greater than an area of the first inner hole edge, and an area of the second outer hole edge is greater than an area of the second inner hole edge.

14. The plate connecting structure of claim 8, wherein the at least one board edge has a support platform for supporting a bridge structure located between the first rivet hole and the second rivet hole.

* * * * *